(12) United States Patent
Ogawa et al.

(10) Patent No.: US 12,310,184 B2
(45) Date of Patent: May 20, 2025

(54) DISPLAY DEVICE AND MANUFACTURING METHOD THEREFOR

(71) Applicant: Japan Display Inc., Tokyo (JP)

(72) Inventors: Yasuhiro Ogawa, Tokyo (JP); Hiroshi Tabatake, Tokyo (JP); Akihito Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 562 days.

(21) Appl. No.: 17/582,044

(22) Filed: Jan. 24, 2022

(65) Prior Publication Data

US 2022/0149127 A1 May 12, 2022

Related U.S. Application Data

(63) Continuation of application No. PCT/JP2020/027487, filed on Jul. 15, 2020.

(30) Foreign Application Priority Data

Aug. 1, 2019 (JP) .................................. 2019-142030

(51) Int. Cl.
*H10K 59/122* (2023.01)
*H10K 71/00* (2023.01)
(Continued)

(52) U.S. Cl.
CPC ........... *H10K 59/122* (2023.02); *H10K 71/00* (2023.02); *H10K 59/1201* (2023.02); *H10K 59/35* (2023.02); *H10K 59/352* (2023.02)

(58) Field of Classification Search
CPC .. H10K 59/122; H10K 71/00; H10K 59/1201; H10K 59/35; H10K 59/352;
(Continued)

(56) References Cited

U.S. PATENT DOCUMENTS 10,326,102 B2 * 6/2019 Park ..................... H10K 59/352
10,635,209 B2 * 4/2020 Seong ................ H10K 50/8428
(Continued)

FOREIGN PATENT DOCUMENTS

JP 2010-140852 A 6/2010
JP 2013-080661 A 5/2013
(Continued)

OTHER PUBLICATIONS

International Search Report mailed on Sep. 8, 2020, for the corresponding PCT Application No. PCT/JP2020/027487, with English machine translation.

*Primary Examiner* — Kevin Quarterman
(74) *Attorney, Agent, or Firm* — Michael Best & Friedrich LLP (57) ABSTRACT

A display device includes: pixel electrodes; a first insulation layer having openings corresponding to the respective plurality of pixel electrodes, the first insulation layer being on each periphery of the plurality of pixel electrodes; a second insulation layer on an upper surface of the first insulation layer except for a part thereof; and an electroluminescence layer including light-emitting layers overlapping with the pixel electrodes. Each of the light-emitting layers and another one of the light-emitting layers in different light-emitting colors are adjacent to each other, constituting a pair of different-color-emitting layers. The openings include a pair of different-color openings that overlap with the respective pair of different-color-emitting layers. The second insulation layer is at least between the pair of different-color openings and is adjacent to each of the pair of different-color openings entirely along mutually opposed sides of the pair of different-color openings.

4 Claims, 12 Drawing Sheets

(51) Int. Cl.
*H10K 59/12* (2023.01)
*H10K 59/35* (2023.01)

(58) Field of Classification Search
CPC .. H10K 71/16; G09F 9/00; G09F 9/30; H05B 33/10; H05B 33/12; H05B 33/22
See application file for complete search history.

(56) References Cited

U.S. PATENT DOCUMENTS

| | | |
|---|---|---|
| 2013/0199445 A1 | 8/2013 | Sonoda et al. |
| 2014/0117336 A1* | 5/2014 | Kim ................. H10K 50/8426 257/40 |
| 2016/0260902 A1 | 9/2016 | Sonoda et al. |
| 2018/0090549 A1* | 3/2018 | Hamada ................. H10K 59/35 |

FOREIGN PATENT DOCUMENTS

| | | |
|---|---|---|
| JP | 2018-049774 A | 3/2018 |
| WO | 2012/053402 A1 | 4/2012 |

* cited by examiner

DISPLAY DEVICE AND MANUFACTURING METHOD THEREFOR

CROSS-REFERENCE TO RELATED APPLICATION

This application is a continuation application of International Application PCT/JP2020/027487 filed on Jul. 15, 2020, which claims priority from Japanese patent application JP2019-142030 filed on Aug. 1, 2019. The contents of these applications are incorporated herein by reference in their entirety.

BACKGROUND

1. Field

This disclosure relates to a display device and a manufacturing method therefor.

2. Description of the Related Art

A display is known in which some light-emitting layers for emitting light in some colors (e.g., red, green, blue) using organic electroluminescence are arranged in a side-by-side manner. In manufacturing processes of them, each light-emitting layer is deposited using a vapor deposition mask having apertures different in position and size for each light-emitting color, thereby achieving color differentiation for each light-emitting color. In addition, by providing a spacer on an array substrate, the vapor deposition mask is in less contact with the array substrate (JP 2010-140852A). This can reduce scratches on an array substrate and reduce dust generation.

Since the vapor deposition mask is placed in no contact with pixel electrodes, evaporation particles fly even diagonally from the apertures of the vapor deposition mask. Therefore, even a slight misalignment of the vapor deposition mask can cause evaporation particles to be deposited on an adjacent pixel electrode, whereby some of the light-emitting layers in different light-emitting colors may be overlapped, leading to color mixing.

SUMMARY

This disclosure aims to prevent evaporation particles from gathering on an adjacent pixel electrode.

A display device includes: a plurality of pixel electrodes; a first insulation layer having a plurality of openings corresponding to the respective plurality of pixel electrodes, the first insulation layer being on each periphery of the plurality of pixel electrodes; a second insulation layer on an upper surface of the first insulation layer except for a part thereof; and an electroluminescence layer including some light-emitting layers overlapping with the plurality of pixel electrodes. Each of the light-emitting layers and another one of the light-emitting layers in different light-emitting colors are adjacent to each other, constituting a pair of different-color-emitting layers. The plurality of openings include a pair of different-color openings that overlap with the respective pair of different-color-emitting layers. The second insulation layer is at least between the pair of different-color openings and is adjacent to each of the pair of different-color openings entirely along mutually opposed sides of the pair of different-color openings.

A method for manufacturing a display device includes: forming a first insulation layer with a plurality of openings, on each periphery of a plurality of pixel electrodes, the plurality of openings corresponding to the respective plurality of pixel electrodes; forming a second insulation layer on an upper surface of the first insulation layer except for a part thereof; and forming some light-emitting layers to overlap with the plurality of pixel electrodes by some vapor deposition processes. Each of the vapor deposition processes is performed while a vapor deposition mask is on the second insulation layer, to form a group of the light-emitting layers in a corresponding one of some light-emitting colors. During formation of the light-emitting layers, a pair of different-color-emitting layers, the light-emitting colors of which are different, are formed to be adjacent to each other. The plurality of openings includes a pair of different-color openings that overlap with the respective pair of different-color-emitting layers. The second insulation layer is at least between the pair of different-color openings and is adjacent to each of the pair of different-color openings entirely along mutually opposed sides of the pair of different-color openings.

The second insulation layer can prevent evaporation particles from gathering on an adjacent pixel electrode.

DETAILED DESCRIPTION

Embodiments of the present invention will now be described with reference to the drawings. However, the present invention can be implemented in various forms to the extent that it does not depart from the gist thereof, and is not to be construed as limited to the description of the embodiments illustrated below.

The drawings may be represented schematically with respect to the width, thickness, shape, etc. of each part compared to the actual state for the purpose of clarifying the description, but they are only examples and do not limit the interpretation of the present invention. In this specification and each figure, elements having the same functions as those already described with respect to the figures may be marked with the same sign and duplicate explanations may be omitted.

Furthermore, in the detailed description of the present invention, when specifying the positional relationship between one component and another component, "above" and "below" shall include not only cases where the component is located directly above or directly below a certain component, but also cases where a further component is interposed in between, unless otherwise specified.

First Embodiment

Figure 1:
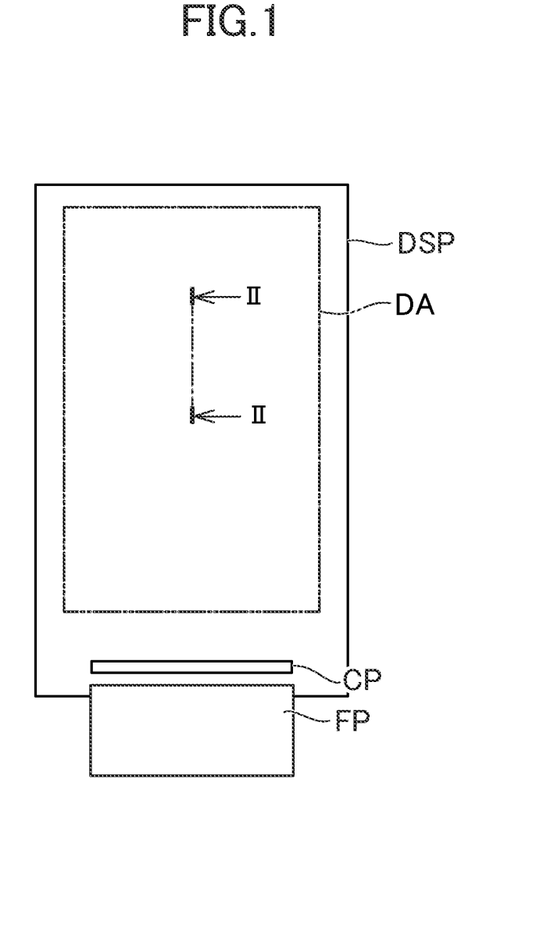
FIG. 1 is a plan view of a display device according to a first embodiment.

FIG. 1 is a plan view of a display device according to a first embodiment. The display device includes a display DSP. The display DSP is flexible and can be bent outside a display area DA in which images are displayed. The display DSP has an integrated circuit chip CP mounted thereon for driving elements to display the images. A flexible printed circuit board FP is connected to the display DSP outside the display area DA.

The display device is, for example, an organic electroluminescent display device. In the display area DA, unit pixels (sub-pixels) in some colors such as red (R), green (G), and blue (B) are combined to form a full-color pixel, whereby a full-color image is displayed.

Figure 2:
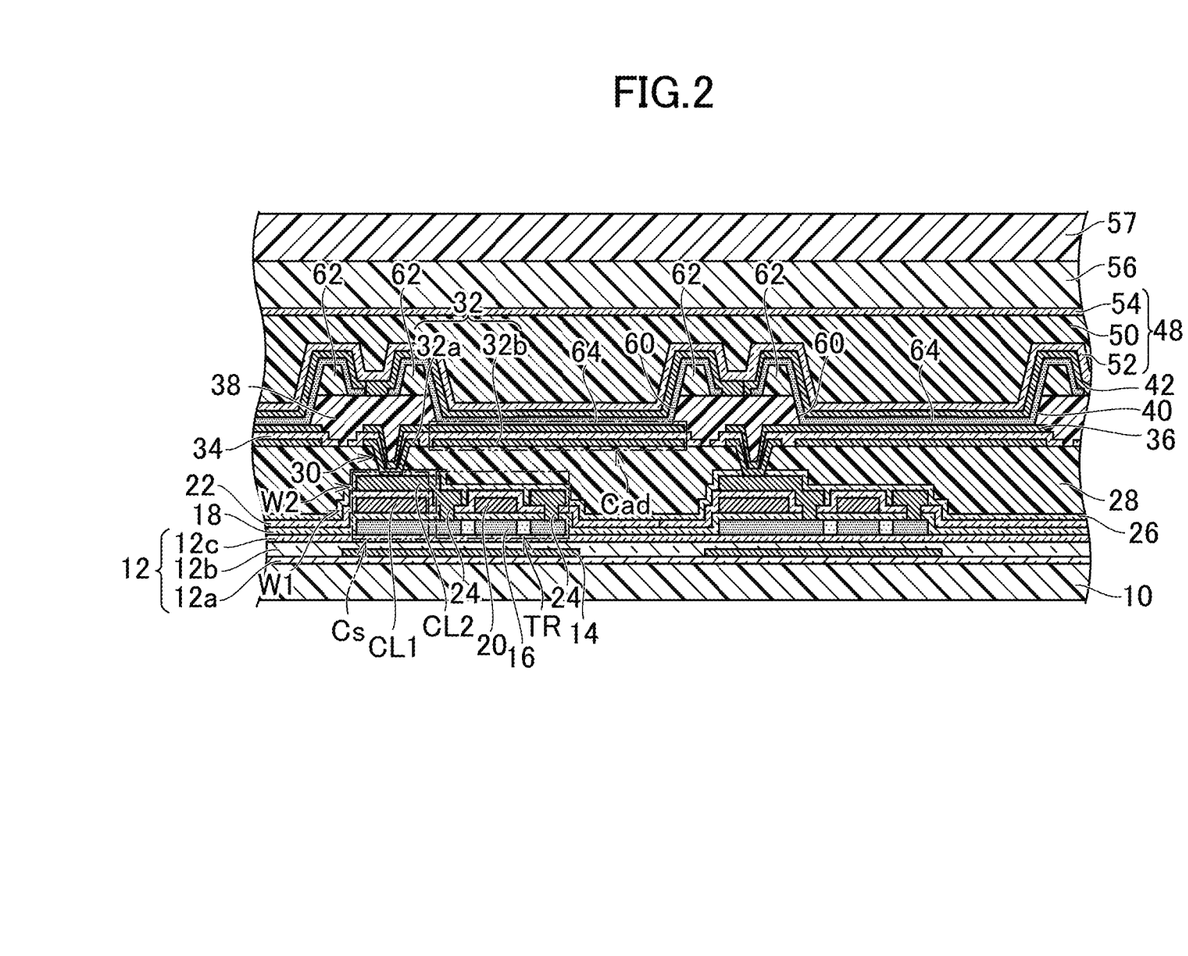
FIG. 2 is a II-II cross-sectional view of the display device in FIG. 1.

FIG. 2 is a II-II cross-sectional view of the display device in FIG. 1. A substrate 10 is made of a flexible resin such as a polyimide for being used to be bent. A barrier inorganic film 12 (undercoat layer) is laminated on the substrate 10. The barrier inorganic film 12 has a three-layer structure of a silicon oxide film 12a, silicon nitride film 12b, and a silicon oxide film 12c. The lowermost silicon oxide film 12a is used to improve adhesion to the substrate 10, the middle silicon nitride film 12b is used for a blocking film against external moisture and impurities, and the uppermost silicon oxide film 12c is used for a blocking film for preventing hydrogen atoms in the silicon nitride film 12b from diffusing into a semiconductor layer 16 of a thin film transistor, although this structure is substitutable and a single layer or a two-layer lamination may be employed.

A functional film 14 may be formed in accordance with a location where the thin film transistor TR is formed. The functional film 14 can suppress characteristic changes of the thin film transistor TR due to penetration of light from a back of a channel, or can give a back gate effect to the thin film transistor TR by being formed from a conductive material to provide a predetermined potential to the thin film transistor. Here, after forming the silicon oxide film 12a, the functional film 14 is formed in an island shape in accordance with the location where the thin film transistor TR is formed, and then the silicon nitride film 12b and the silicon oxide film 12c are laminated, whereby the functional film 14 is sealed in the barrier film 12, or, alternatively, the functional film 14 may be formed first on the substrate 10, and then the barrier inorganic film 12 may be formed.

The thin film transistor TR is formed on the barrier inorganic film 12. Using a polysilicon thin film transistor as an example, only an Nch transistor is shown here, but a Pch transistor may be formed at the same time. The semiconductor layer 16 of the thin film transistor TR adopts a structure in which a low-concentration impurity region is provided between a channel region and a source/drain region. As the gate insulating film 18, a silicon oxide film is used here. The gate electrode 20 is part of the first wiring layer W1 formed from a molybdenum tungsten alloy. In addition to the gate electrode 20, a first wiring layer W1 has a first holding capacitance line CL1. The first holding capacitance line CL1 and the semiconductor layer (source/drain region) constitute a part of the holding capacitance Cs having the gate insulating film 18 between them.

An interlayer insulation film 22 (silicon oxide film, silicon nitride film) is laminated on the gate electrode 20. On the interlayer insulation film 22, a second wiring layer W2 including a portion to be a source/drain electrode 24 is formed. Herein, a three-layer lamination structure of titanium, aluminum, and titanium is employed. The first holding capacitance line CL1 (part of the first wiring layer W1) and the second holding capacitance line CL2 (part of the second wiring layer W2) constitute another part of the holding capacitance Cs having the interlayer insulation film 22 between them.

A passivation film 26 is formed on the interlayer insulation film 22 to cover the second wiring layer W2 (source/drain electrode 24). A planarization organic film 28 is provided on the passivation film 26. The planarization organic film 28 is formed from a resin such as a photosensitive acrylic because of superiority in surface flatness to an inorganic insulating material possibly formed by CVD (Chemical Vapor deposition).

The planarization organic film 28 and the passivation film 26 are removed at a pixel contact portion 30, and an indium tin oxide (ITO) film 32 is formed on them. The indium tin oxide film 32 includes a first transparent conductive film 32a and a second transparent conductive film 32B that are separated from each other. The second wiring layer W2, whose surface is exposed by removal of the planarization organic film 28 and the passivation film 26, is covered with the first transparent conductive film 32a. A silicon nitride film 34 is provided on the planarization organic film 28 to cover the first transparent conductive film 32a. The silicon nitride film 34 has an opening at the pixel contact portion 30, and a pixel electrode 36 is laminated to be electrically continuous to the source/drain electrode 24 through the opening. The pixel electrode 36 is formed as a reflective electrode and has a three-layer lamination structure of an indium zinc oxide film, an Ag film, and an indium zinc oxide film. Here, an indium tin oxide film may be used instead of the indium zinc oxide film. The pixel electrode 36 laterally extends from the pixel contact portion 30 to above the thin film transistor TR. The display device has a plurality of pixel electrodes 36.

The second transparent conductive film 32b is provided adjacent to the pixel contact portion 30 and below the pixel electrode 36 (further below the silicon nitride film 34). The second transparent conductive film 32b, the silicon nitride film 34, and the pixel electrode 36 overlap with one another to form an additional capacitance Cad.

A first insulation layer 38, which is called a bank (rib) and serves as a partition between adjacent pixel regions, is formed on the planarization organic film 28 and above the pixel contact portion 30. The photosensitive acrylic is used for the first insulation layer 38, just like the planarization organic film 28. The first insulation layer 38 has a plurality of openings 60 so as to expose surfaces of the pixel electrodes 36 as light-emitting areas. The openings 60 correspond to the respective pixel electrodes 36. The first insulation layer 38 is on each periphery of the pixel electrodes 36.

The planarization organic film 28 and the first insulation layer 38 are in contact with each other through the openings in the silicon nitride film 34 between them. This allows moisture and gases that are desorbed from the planarization organic film 28 to be drawn out through the first insulation layer 38 during heat treatment after formation of the first insulation layer 38. The display device has a second insulation layer 62. The second insulation layer 62 rests on an upper surface of the first insulation layer 38 except for part thereof.

An electroluminescence layer 40 made of organic materials, for example, is laminated on the pixel electrodes 36. The electroluminescence layer 40 is on the second insulation layer 62. In a region where the second insulation layer 62 is not provided, the electroluminescence layer 40 is on the first insulation layer 38. The electroluminescence layer 40 includes some light-emitting layers 64. The light-emitting layers 64 overlap with the pixel electrodes 36. Although the electroluminescence layer 40 may be a single layer, the electroluminescence layer 40 may have a lamination structure of, in order from the pixel electrode 36 side, a hole injection layer and a hole transport layer not illustrated, a light-emitting layer 64, and an electron transport layer and an electron injection layer not illustrated. The hole injection layer, the hole transport layer, the electron transport layer, and the electron injection layer, not illustrated, may continuously cover all the light-emitting layers 64.

Figure 3:
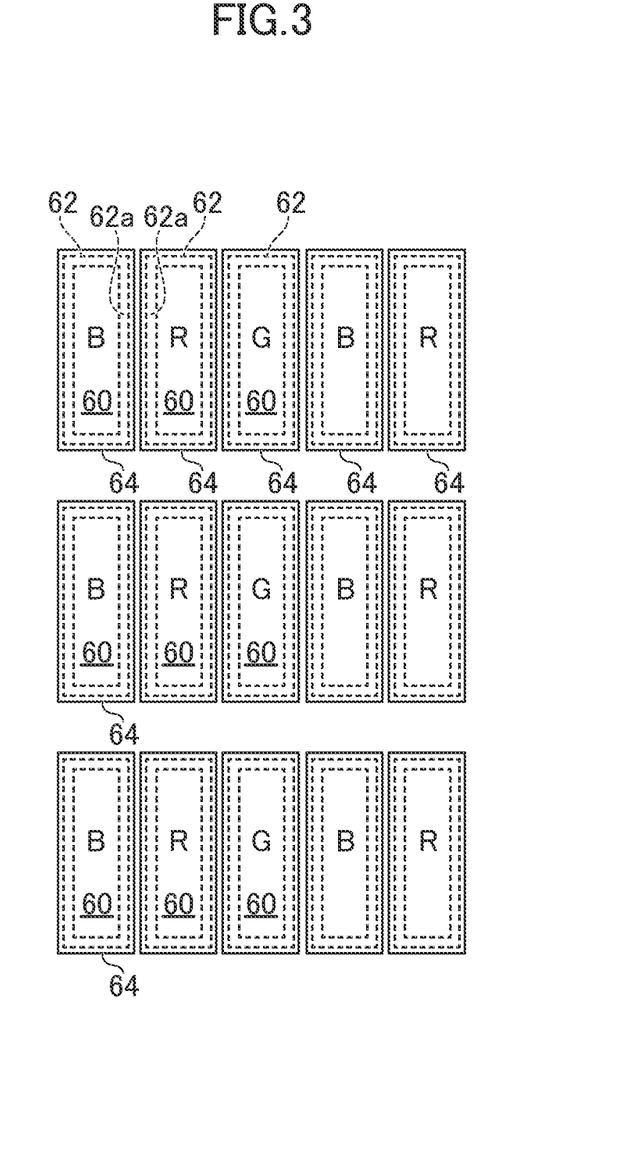
FIG. 3 is a partially enlarged view of a display area in FIG. 1.

FIG. 3 is a partially enlarged view of a display area DA in FIG. 1. Light-emitting colors of the light-emitting layers 64 are, for example, red (R), green (G), and blue (B). Each light-emitting layer 64 and another light-emitting layer 64 in different light-emitting colors are adjacent to each other to constitute a pair of different-color-emitting layers. In an example of FIG. 3, a pair of light-emitting layers 64 adjacent to each other in a lateral direction is the pair of different-color-emitting layers. Correspondingly, the openings 60 include a pair of different-color openings that overlap with the respective pair of different-color-emitting layers. In the example of FIG. 3, the pair of openings 60 laterally adjacent to each other are the pair of different-color openings.

The second insulation layer 62 continuously surrounds each opening 60. The second insulation layer 62 is between at least the pair of different-color openings. The second insulation layer 62 is adjacent to each of the pair of different-color openings entirely along mutually opposed sides of the pair of different-color openings. The second insulation layer 62 has a pair of wall portions 62a adjacent to the respective pair of different-color openings. The pair of wall portions 62a are spaced apart from each other. The second insulation layer 62 includes some separated portions.

As shown in FIG. 2, a counter electrode 42 is provided on the electroluminescence layer 40. Here, a top emission structure being adopted, the counter electrode 42 is transparent. For example, a magnesium layer and a silver layer are formed as a thin film enough to pass light emitted from the electroluminescence layer 40. In accordance with an order of formation of the electroluminescence layer 40 described above, the pixel electrode 36 becomes an anode and the counter electrode 42 becomes a cathode. The pixel electrodes 36, the counter electrodes 42, and the light-emitting layers 64 constitute a plurality of light-emitting elements.

A sealing layer 48 is formed on the counter electrode 42 to cover the electroluminescence layer 40. The sealing layer 48 has a function to prevent external moisture from entering the electroluminescence layer 40 previously formed, requiring a high gas barrier property. The sealing layer 48 has a lamination structure of an organic film 50, and a first inorganic film 52 and a second inorganic film 54 (e.g., silicon nitride films) sandwiching it. A resin layer 56 and a polarizing plate 57 (e.g., circular polarizing plate) are laminated on the sealing layer 48.

[Manufacturing Method]

Next, a manufacturing method for the display device in the first embodiment will be described. The manufacturing method includes forming the first insulation layer 38, as shown in FIG. 2. The first insulation layer 38 is formed on each periphery of the pixel electrodes 36. The first insulation layer 38 is formed to have the openings 60 corresponding to the respective pixel electrodes 36.

The manufacturing method includes forming the second insulation layer 62, as shown in FIG. 2. The second insulation layer 62 is formed on the upper surface of the first insulation layer 38 except for a part thereof (see FIG. 3). The second insulation layer 62 is formed to continuously surround each opening 60. The second insulation layer 62 is formed to include the separated portions.

As shown in FIG. 3, the second insulation layer 62 is formed at least between the pair of different-color openings (pair of openings 60 horizontally arranged in FIG. 3) and is adjacent to each of the pair of different-color openings entirely along the mutually opposed sides of the pair of different-color openings. The second insulation layer 62 has the pair of wall portions 62a adjacent to the respective pair of different-color openings, and the pair of wall portions 62a are spaced apart from each other.

The manufacturing method includes forming the light-emitting layers 64, as shown in FIG. 3. During formation of the light-emitting layers 64, the pair of different-color-emitting layers (pair of light-emitting layers 64 horizontally arranged in FIG. 3) are formed in the different light-emitting colors and adjacent to each other. The light-emitting layers 64 are formed by vapor deposition.

Figure 4:
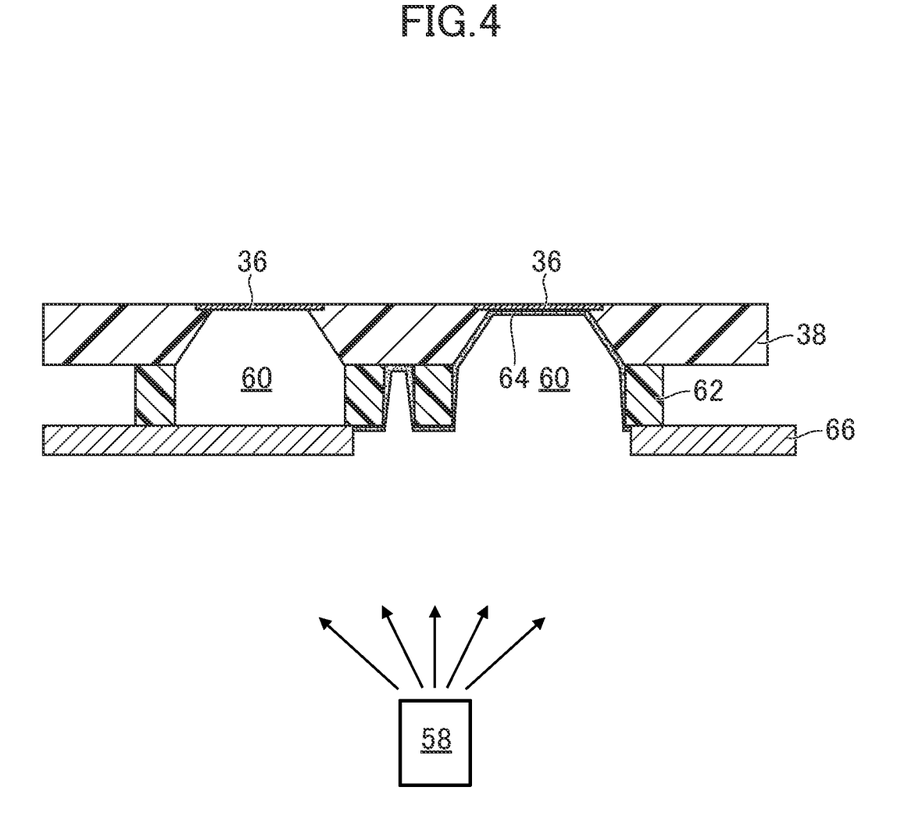
FIG. 4 is a diagram of a process of vapor deposition.

FIG. 4 is a diagram of a process of the vapor deposition. In the vapor deposition process, evaporation materials 58 are heated in a vacuum to be melt, evaporated, or sublimated, and the evaporated or sublimated particles (atoms or molecules) are attached or deposited to form a thin film.

The manufacturing method includes some processes of the vapor deposition. By the processes of the vapor deposition, the light-emitting layers 64 are formed to overlap with the respective pixel electrodes 36. By one of the processes of the vapor deposition, a group of the light-emitting layers 64 are formed in a corresponding one of the light-emitting colors. The pair of different-color-emitting layers overlap with the respective pair of different-color openings (see FIG. 3).

Each of the processes of the vapor deposition is performed while a vapor deposition mask 66 is on the second insulation layer 62. Accordingly, in the processes of the vapor deposition, one of the pair of different-color openings is covered with the vapor deposition mask 66. This prevents the evaporation particles from gathering on the adjacent pixel electrode 36. This is particularly effective when the vapor deposition mask 66 is misaligned in position as shown in FIG. 4.

Second Embodiment

Figure 5:
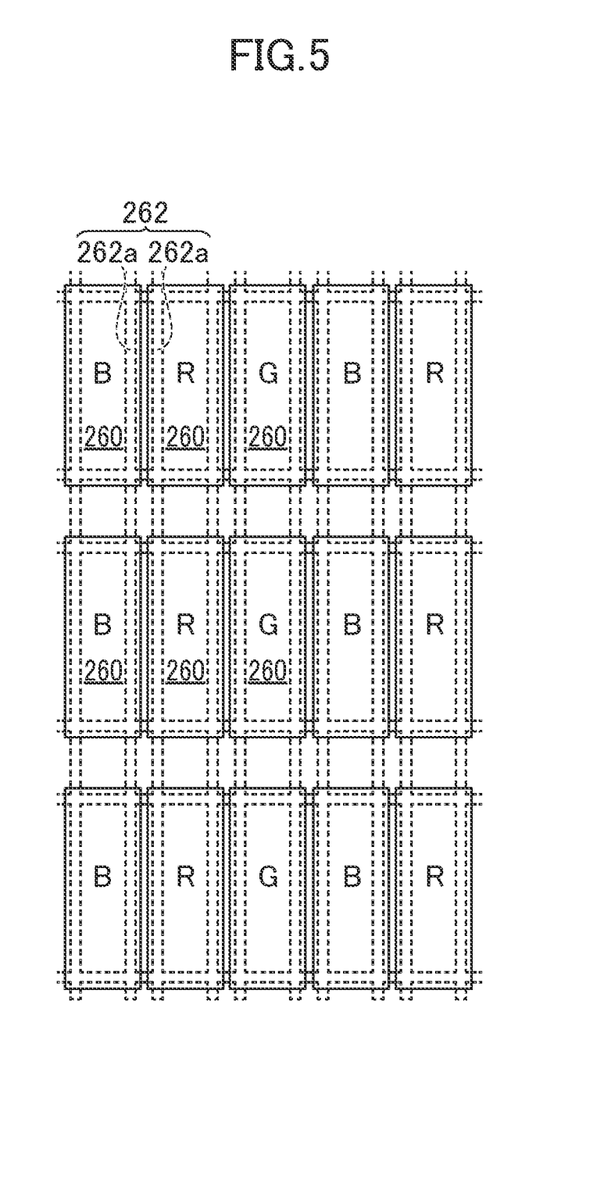
FIG. 5 is a partially enlarged plan view of a display device according to a second embodiment.

FIG. 5 is a partially enlarged plan view of a display device according to a second embodiment. In this embodiment, the second insulation layer 262 is in a lattice shape.

The second insulation layer 262 continuously surrounds each opening 260. The second insulation layer 262 has the pair of wall portions 262a adjacent to the respective pair of different-color openings 262. The pair of wall portions 262a are space apart from each other. The second insulation layer 262 has the continuous overall shape.

In the manufacturing process, the second insulation layer 262 is formed to continuously surround each opening 260. The second insulation layer 262 has the pair of wall portions 262a adjacent to the respective pair of different-color openings 262. The pair of wall portions 262a are spaced apart from each other. The second insulation layer 262 is formed to have the continuous overall shape.

Third Embodiment

Figure 6:
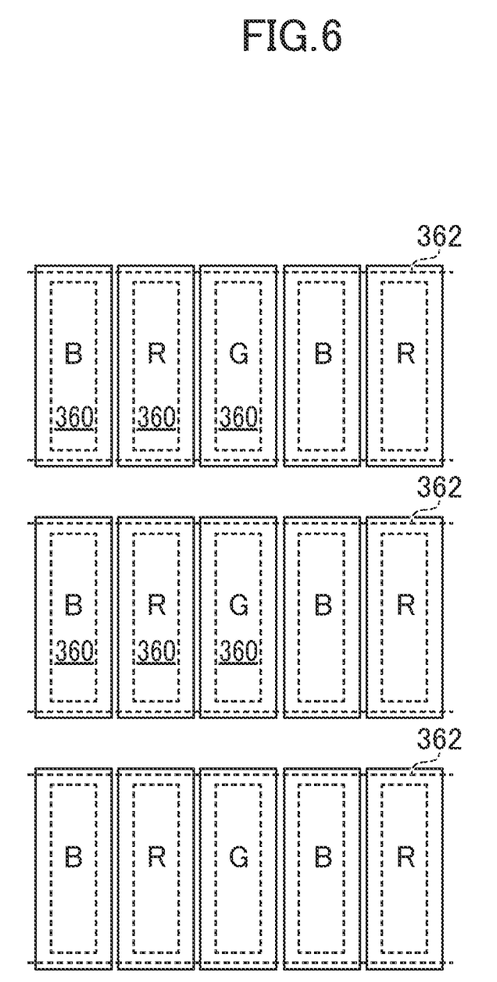
FIG. 6 is a partially enlarged plan view of a display device according to a third embodiment.

FIG. 6 is a partially enlarged plan view of a display device according to a third embodiment. In this embodiment, the second insulation layer 362 is disposed without a gap between the pair of different-color openings (pair of openings 360 horizontally arranged in FIG. 6).

The second insulation layer 362 continuously surrounds each opening 360. The second insulation layer 362 is located entirely between the pair of different-color openings. By contrast, the second insulation layer 362 is separated into some portions to form the space between the pair of openings 360 (pair of openings 360 vertically arranged in FIG. 6), the light-emitting colors of which are equivalent.

In the manufacturing process, the second insulation layer 362 is formed to continuously surround each opening 360. The second insulation layer 362 is formed entirely between the pair of different-color openings. The second insulation layer 362 is formed to include the separated portions.

Fourth Embodiment

Figure 7:
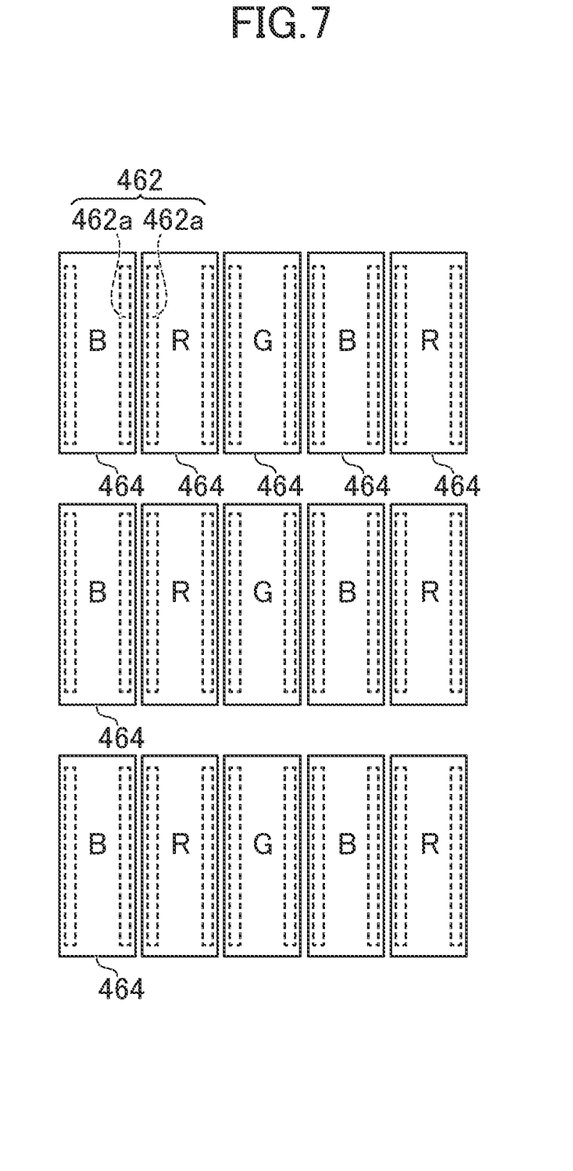
FIG. 7 is a partially enlarged plan view of a display device according to a fourth embodiment.

FIG. 7 is a partially enlarged plan view of a display device according to a fourth embodiment. Each of the light-emitting layers 464 and another one of the light-emitting layers 464 in the equivalent light-emitting colors are also adjacent to each other, constituting the pair of same-color-emitting layers (pair of light-emitting layers 464 vertically arranged in FIG. 7). The second insulation layer 462 avoids being located between the pair of same-color-emitting layers. In other words, the second insulation layer 462 has the space between the pair of same-color-emitting layers.

The second insulation layer 462 has the pair of wall portions 462a adjacent to the respective pair of different-color openings. The pair of wall portions 462a are spaced apart from each other. The second insulation layer 462 includes the separated portions.

In the manufacturing process, each of the light-emitting layers 464 and another one of the light-emitting layers 464 in the equivalent light-emitting colors are also adjacent to each other, constituting the pair of same-color-emitting layers. The second insulation layer 462 is formed to avoid being positioned between the pair of same-color-emitting layers. The second insulation layer 462 has the pair of wall portions 462a adjacent to the respective pair of different-color openings, and is formed to have the space between the pair of wall portions 462a. The second insulation layer 462 is formed to include the separated portions.

Fifth Embodiment

Figure 8:
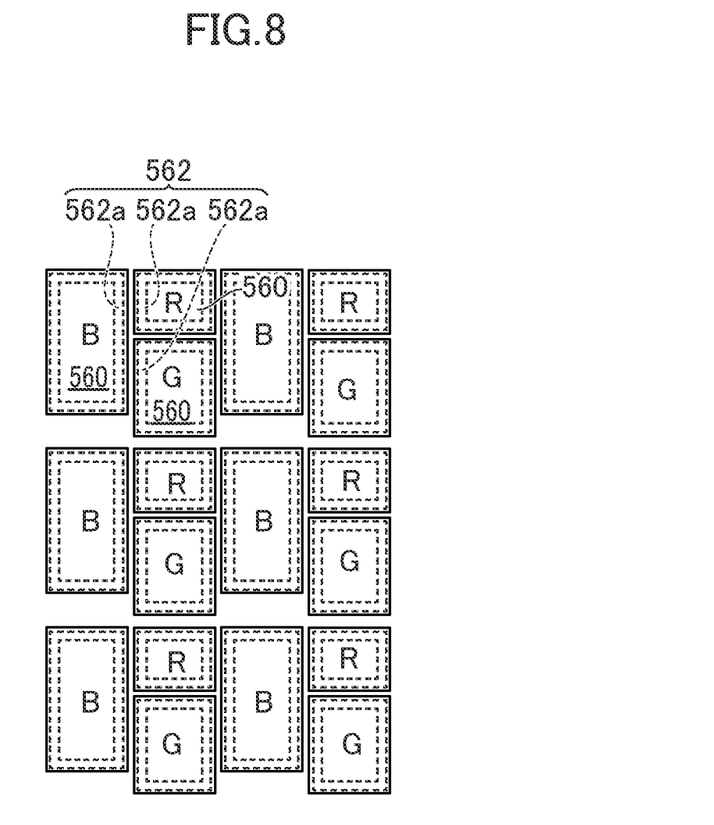
FIG. 8 is a partially enlarged plan view of a display device according to a fifth embodiment.

FIG. 8 is a partially enlarged plan view of a display device according to a fifth embodiment. In this embodiment, the sub-pixels are arranged in a delta array.

The second insulation layer 562 continuously surrounds each opening 560. The second insulation layer 562 has the pair of wall portions 562a adjacent to the respective pair of different-color openings. In an example of FIG. 8, the openings 560 in B and R are the pair of different-color openings, the openings 560 in B and G are the pair of different-color openings, and the openings 560 in R and G are also the pair of different-color openings. The pair of wall portions 562a are spaced apart from each other. The second insulation layer 562 includes the separated portions.

In the manufacturing process, the second insulation layer 562 is formed to continuously surround each opening 560. The second insulation layer 562 has the pair of wall portions 562a adjacent to the respective pair of different-color openings, and is formed to have the space between the pair of wall portions 562a. The second insulation layer 562 is formed to have the separated portions.

Sixth Embodiment

Figure 9:
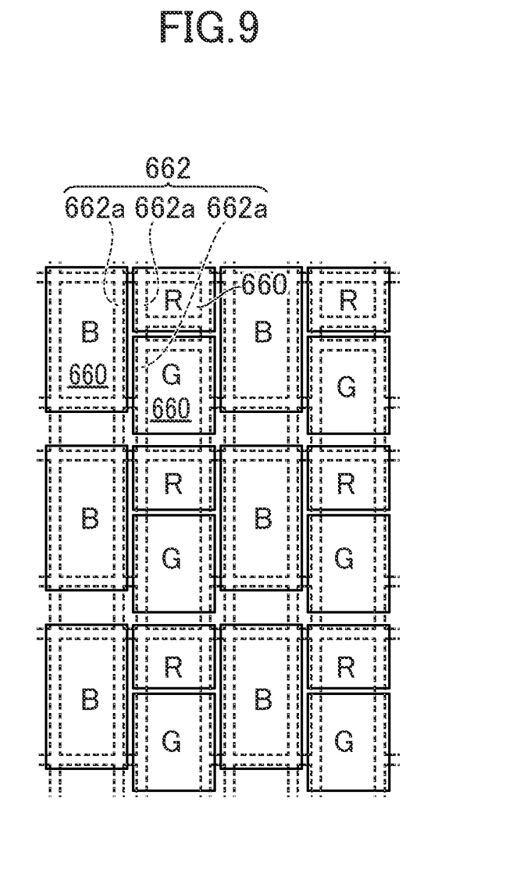
FIG. 9 is a partially enlarged plan view of a display device according to a sixth embodiment is enlarged.

FIG. 9 is a partially enlarged plan view of a display device according to a sixth embodiment is enlarged. In this embodiment, the sub-pixels are arranged in the delta array.

The second insulation layer 662 continuously surrounds each opening 660. The second insulation layer 662 has the pair of wall portions 662a adjacent to the respective pair of different-color openings. The pair of wall portions 662a are spaced apart from each other. The second insulation layer 662 has the continuous overall shape.

In the manufacturing process, the second insulation layer 662 is formed to continuously surround each opening 660. The second insulation layer 662 has the pair of wall portions 662a adjacent to the respective pair of different-color openings, and is formed to have the space between the pair of wall portions 662a. The second insulation layer 662 is formed to have the continuous overall shape.

Seventh Embodiment

Figure 10:
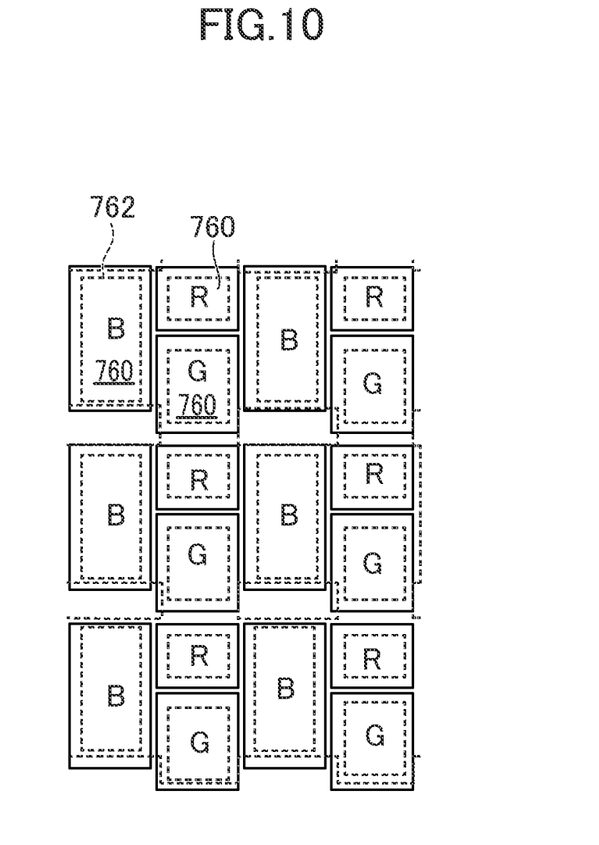
FIG. 10 is a partially enlarged plan view of a display device according to a seventh embodiment.

FIG. 10 is a partially enlarged plan view of a display device according to a seventh embodiment. In this embodiment, the sub-pixels are arranged in the delta array.

The second insulation layer 762 continuously surrounds each opening 760. The second insulation layer 762 is located entirely between the pair of different-color openings. The second insulation layer 762 has the continuous overall shape.

In the manufacturing process, the second insulation layer 762 is formed to continuously surround each opening 760. The second insulation layer 762 is formed to be located entirely between the pair of different-color openings. The second insulation layer 762 is formed to have the continuous overall shape.

Eighth Embodiment

Figure 11:
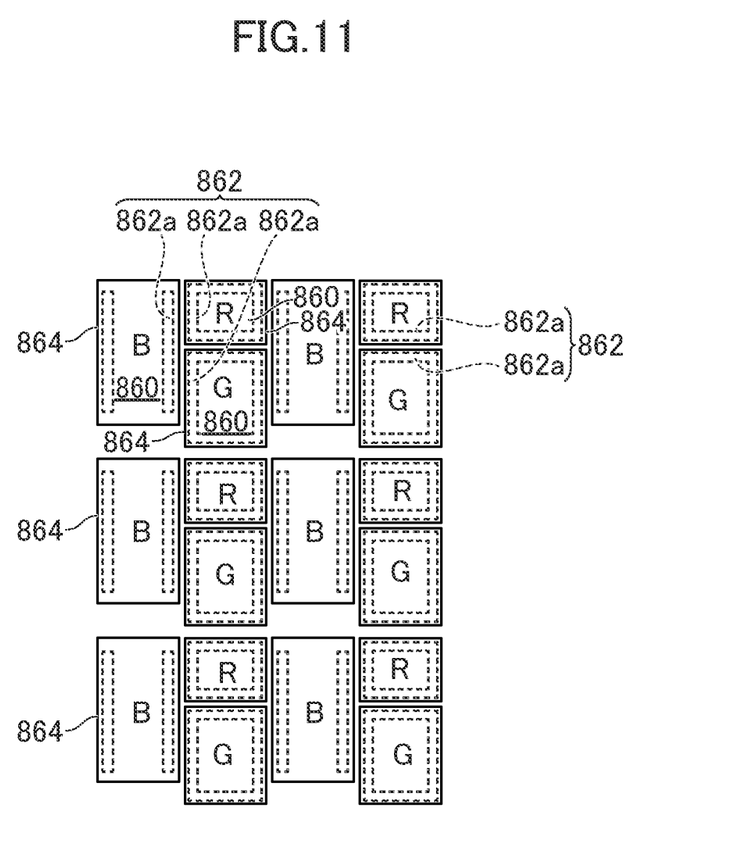
FIG. 11 is a partially enlarged plan view of a display device according to an eighth embodiment.

FIG. 11 is a partially enlarged plan view of a display device according to an eighth embodiment. In this embodiment, the sub-pixels are arranged in the delta array.

Each of the light-emitting layers 864 and another one of the light-emitting layers 864 in the equivalent light-emitting colors are also adjacent to each other, constituting the pair of same-color-emitting layers (light-emitting layer 864 in B vertically arranged in FIG. 11). The second insulation layer 862 avoids being located between the pair of same-color-emitting layers.

The second insulation layer 862 has the pair of wall portions 862a adjacent to the respective pair of different-color openings. In an example of FIG. 11, the openings 860 in B and R are the pair of different-color openings, the openings 860 in B and G are the pair of different-color openings, and the openings 860 in R and G are also the pair of different-color openings. The pair of wall portions 862*a* are spaced apart from each other. The second insulation layer 862 includes the separated portions.

In the manufacturing process, each of the light-emitting layers 864 and another one of the light-emitting layer 864 in the equivalent light-emitting colors are also adjacent to each other, constituting the pair of same-color-emitting layers. The second insulation layer 862 is formed so as to avoid being positioned between the pair of same-color-emitting layers. The second insulation layer 862 has the pair of wall portions 862*a* adjacent to the respective pair of different-color openings, and is formed to have the space between the pair of wall portions 862*a*. The second insulation layer 862 is formed to include the separated portions.

Ninth Embodiment

Figure 12:
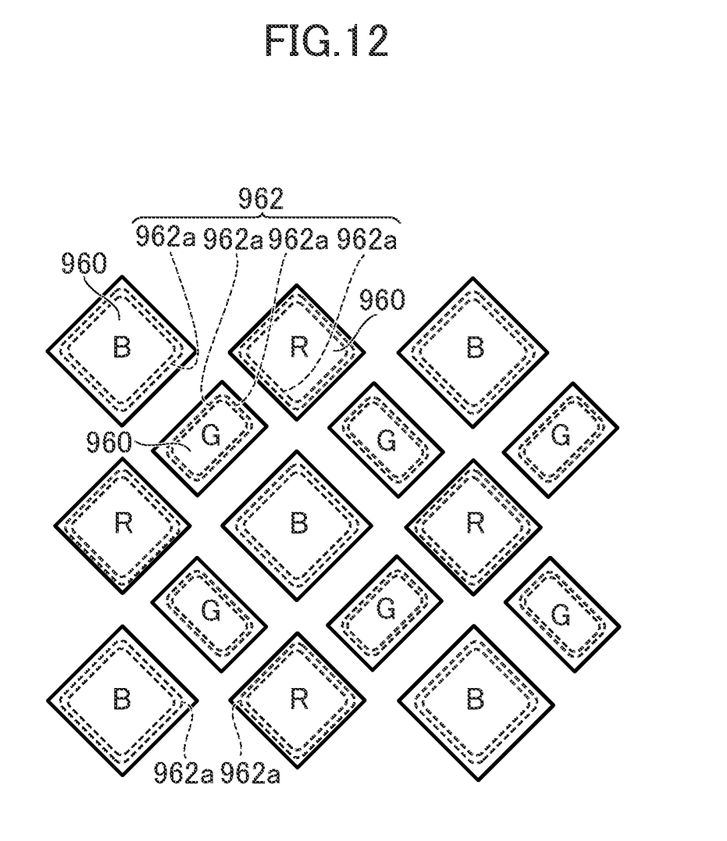
FIG. 12 is a partially enlarged plan view of a display device according to a ninth embodiment.

FIG. 12 is a partially enlarged plan view of a display device according to a ninth embodiment. In this embodiment, one pixel is composed of sub-pixels whose light-emitting colors are a combination of R and G (red, green) or B and G (blue, green).

The second insulation layer 962 continuously surrounds each opening 960. The second insulation layer 962 has the pair of wall portions 962*a* adjacent to the respective pair of different-color openings. In an example of FIG. 12, the openings 960 in B and G are the pair of different-color openings, and the openings 960 in R and G are the pair of different-color openings, and the openings 960 in R and B are also the pair of different-color openings. The pair of wall portions 962*a* are spaced apart from each other. The second insulation layer 962 includes the separated portions.

In the manufacturing process, the second insulation layer 962 is formed to continuously surround each opening 960. The second insulation layer 962 has the pair of wall portions 962*a* adjacent to the respective pair of different-color openings, and is formed to have the space between the pair of wall portions 962*a*. The second insulation layer 962 is formed to have the separated portions.

The embodiments described above are not limited and different variations are possible. The structures explained in the embodiments may be replaced with substantially the same structures and other structures that can achieve the same effect or the same objective.

What is claimed is:

1. A display device comprising:
a plurality of pixel electrodes;
a first insulation layer having a plurality of openings corresponding to the respective plurality of pixel electrodes, the first insulation layer being on each periphery of the plurality of pixel electrodes;
a second insulation layer on a part of an upper surface of the first insulation layer; and
a plurality of light-emitting layers overlapping with a corresponding one of the plurality of pixel electrodes, wherein
one of the plurality of light-emitting layers and another one of the plurality of light-emitting layers in different light-emitting colors are adjacent to each other, constituting a pair of different-color-emitting layers,
the plurality of openings include a pair of different-color openings that overlap with the respective pair of different-color-emitting layers,
the second insulation layer is at least between the pair of different-color openings and is adjacent to each of the pair of different-color openings entirely along mutually opposed sides of the pair of different-color openings,
the second insulation layer continuously surrounds each of the plurality of openings, and
a portion of the second insulation layer surrounding one of the pair of different-color openings and another portion of the second insulation layer surrounding another one of the pair of different-color openings are formed so as to be connected to each other.

2. The display device according to claim 1, wherein
one of the plurality of light-emitting layers and another one of the light-emitting layers in equivalent light-emitting colors are also adjacent to each other, constituting a pair of same-color-emitting layers, and
the second insulation layer avoids being located between the pair of same-color-emitting layers.

3. The display device according to claim 1, wherein the second insulation layer is located entirely between the pair of different-color openings.

4. The display device according to claim 1, wherein the second insulation layer has a continuous overall shape.

* * * * *